(12) United States Patent
Nikmanesh

(10) Patent No.: US 6,587,580 B1
(45) Date of Patent: Jul. 1, 2003

(54) STENCIL PRINTING PROCESS OPTIMIZATION FOR CIRCUIT PACK ASSEMBLY USING NEURAL NETWORK MODELING

(75) Inventor: Khalil N. Nikmanesh, Broomfield, CO (US)

(73) Assignee: Avaya Technology Corp., Basking Ridge, NJ (US)

(*) Notice: Subject to any disclaimer, the term of this patent is extended or adjusted under 35 U.S.C. 154(b) by 0 days.

(21) Appl. No.: 09/306,590

(22) Filed: May 6, 1999

(51) Int. Cl.[7] .................................................. G06K 9/00
(52) U.S. Cl. ........................ 382/145; 382/146; 382/149; 382/156
(58) Field of Search ................................ 382/145, 146, 382/147, 149, 150, 151, 155, 156, 157, 158

(56) References Cited

U.S. PATENT DOCUMENTS 5,751,910 A * 5/1998 Bryant et al. ............... 382/145
5,882,720 A * 3/1999 Legault et al. .................. 427/8
5,912,984 A * 6/1999 Michael et al. ............. 382/149
6,292,582 B1 * 9/2001 Lin et al. ..................... 382/149

* cited by examiner

Primary Examiner—Thomas D. Lee
(74) Attorney, Agent, or Firm—Patton Boggs LLP

(57) ABSTRACT

A system for determining the optimal settings for parameter of a stencil printing machine. The system generates a model mapping parameter inputs to output results. The model is then used to determine the optimal settings of parameter inputs in order to produce the desired results. One form of mapping is to generate a neural network model of a system. The neural network is generated from data that includes multiple sets of input parameter settings and the resulting output associated with the inputs. Back propagation is then performed on the neural network to determine the optimal settings.

10 Claims, 3 Drawing Sheets

STENCIL PRINTING PROCESS OPTIMIZATION FOR CIRCUIT PACK ASSEMBLY USING NEURAL NETWORK MODELING

FIELD OF THE INVENTION

This invention relates to a stencil printing process for circuits. More particularly, this invention relates to a system for determining the proper setting for a plurality of parameters for stencil printing equipment in order to optimize the placement, accuracy, and volume of solder paste on a circuit and reduce the number of defects.

PROBLEM

In today's society, most electronic equipment is made of one or more circuit boards. Circuit boards are a plastic or other non-conductive material having leads placed on the material which connect two or more integrated circuits chips affixed to the board. A stencil printing machine places solder paste on the board in a pattern that was pre-programmed in the machine. It is a problem that the placement of the solder paste onto the circuit board must be precise in both placement and height. If the placement of solder paste is wrong, the alignment between a pin from a chip or other circuit and the lead on the board may have a gap causing a short in the circuit. If the height of the solder paste on the board is inconsistent from lead to lead, a pin from a chip or another circuit may either not contact the lead or may protrude too far into the lead. These may cause a short or other problems in the circuit.

As circuits become smaller, the space between leads on a board decreases. As the space between leads decreases, the placement and height of the solder paste becomes more critical. If the placement of a lead is wrong, it may become to close to an adjacent lead which may cause a short or other problem. If the height is too great, the leads may cause an arc between leads.

For the above reasons, placement of the solder paste on a board is critical. The placement of the solder paste is controlled by the following parameters: squeegee speed of the printing machine, angle of the squeegee, time of separation, snap-off distance, head pressure, and squeegee material. Squeegee speed is the speed that the printer head moves across the board. Angle of the squeegee is the angle of the squeegee blade with respect to the board. Time of separation is the amount of time that the printer allows the stencil to remain on the board in order for the solder paste to settle in position on the board before the stencil is removed. Snap-off distance is the distance from the top of the board to the bottom of the stencil. Head pressure is the amount of force applied by the squeegee to the paste applied to the board. Squeegee material can be metal or rubber. In the past, experimentation as well as trial and error were used to set these parameters. However, both of these methods are imprecise and time consuming to accomplish. There is a need in the art for a system to determine the optimal settings of these parameters.

SOLUTION

The above and other problems are solved and an advance in the art is made by the provision of the system for determining optimal settings of a stencil printer in accordance with the present invention. The present invention reduces the time needed to determine optimal settings for the printer by providing an automated system that does not rely upon experimentation as well as trial and error. Furthermore, the system of the present invention can monitor the current settings and results to modify the settings and increase the accuracy of the settings.

The system of the present invention is provided by instructions executed by a either a controller attached to a stencil printing machine or by a computer system that is not connected to the operation of the stencil printing machine. The controller adjusts the settings of the stencil printing machine and the computer outputs the correct settings for the machine which then must be manually entered into a stencil printing machine. The instructions executed by either the controller or a computer are stored in a machine readable format on a memory connected to a processor.

The process for optimizing the settings of a stencil printing machine embodied in the instructions is performed in the following manner. First, the system collects data relating the settings of various parameter of the stencil printing machine to the resulting output parameters. The input parameters include squeegee travel speed, angle of the squeegee, time of separation, snap-off distance, head pressure, and squeegee material. The output parameters include but are not limited to settings for the above parameters, print deposit thickness, and print deposit width.

The data is used to generate a neural network that relates the input parameters to the output parameters. A neural network develops correlations between system inputs and outputs that may not have a linear relationship. The correlations are developed by a series of weighted expressions that relate the input to the output. After the neural network is generated, back propagation is used to adjust the input values to optimize the settings of the stencil printing machine for an optimal result. The adjusted input values are then output by the process. The adjusted values then may either be directly applied to the stencil printing machine or a user must adjust the settings manually. Additionally, the system of this invention may also monitor the procedure as the stencil machine operates to receive data that can then be periodically used to calibrate the neural network to make correlations between input parameter and output parameters more precise.

DESCRIPTION OF THE DRAWINGS

The above and other features of a system for optimizing parameters of a stencil printing machine can be understood from the detailed description and the following drawings.

DETAILED DESCRIPTION

Figure 1:
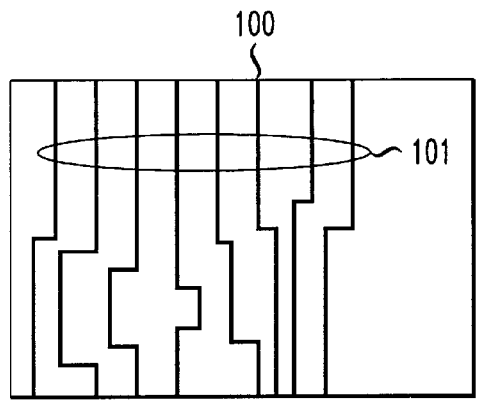
FIG. 1 illustrating leads on a circuit board printed by a stencil printed machine.

The present invention now will be described more fully hereinafter with reference to the accompanying drawings, in which embodiments of the invention are shown. Those skilled in the art will appreciate that the invention may be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements throughout.

FIG. 1 illustrates a circuit board 100 having leads 101. Leads 101 connects circuits from board 101 to pins 102 of a chip 103. Circuit board 100 has multiple leads 101. The space between leads is called the lead pitch. On a typical circuit board 100, the lead pitch is between—millimeters and—millimeters. As the lead pitch between leads 101 decreases, the accuracy of the application of solder paste to circuit board 100 to create the leads must increase to prevent shorts and other problems in the completed circuitry.

Figure 2:
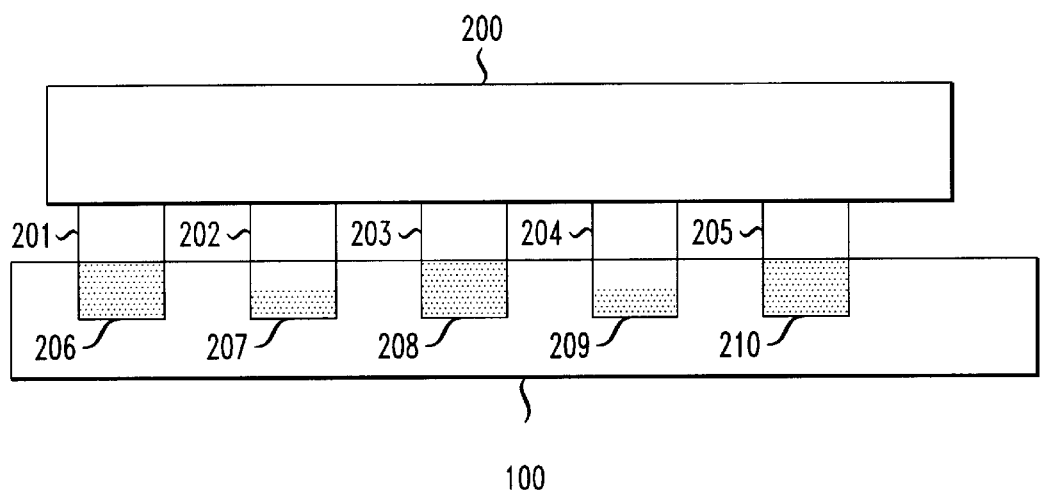
FIG. 2 illustrating a magnified view of pins from a chip being inserted into the leads.

FIG. 2 illustrates a chip 200 having pins 201–205 inserted into leads 206–210. Leads 206–210 were not applied to circuit board 100 evenly and leads 207 and 209 do not have the same height or thickness as leads 206, 208, and 210. Since all leads 206–210 do not have the same thickness, some pins, such as pins 202 and 204, may not contact a lead. This can cause a short or other problems in the circuit. This invention optimizes the settings of a stencil printing machine to reduce the inconsistencies in application of solder paste to circuit board 100.

Figure 3:
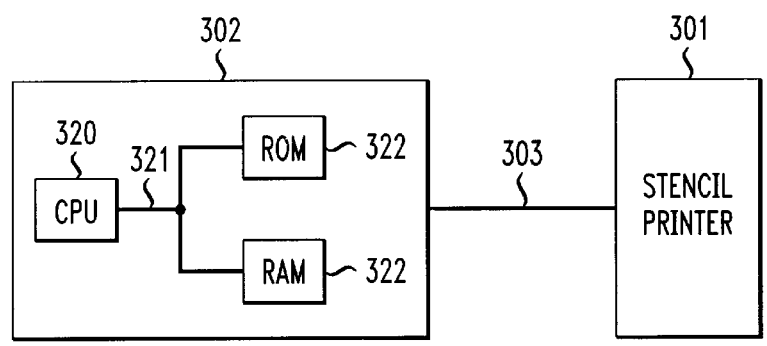
FIG. 3 illustrating a stencil printing machine.

FIG. 3 illustrates a Stencil printing machine 300. The main component of stencil printing machine 301 is solder application mechanism 301. Solder application mechanism 301 is a conventional stencil printing machine that is well known in the art. Stencil printing machine 300 may also include a controller 302. Controller 302 is a electronic processor that controls the settings of printing mechanism 301. Controller 302 includes a processing unit 320 which may be a microprocessor or a CPU of a personal computer. Processing unit 320 may read and write data to a memory over memory bus 321. Read Only Memory (ROM) 322 may be connected to memory bus 321. ROM 322 is a memory storing instructions for applications to be executed by processing unit 320 to monitor and maintain operations solder application apparatus 301. Random Access Memory (RAM) 323 is read from and written to by processing unit 320 via bus 321. RAM 323 is a volatile memory used to store data and instructions for performing applications. It should be noted that although controller 302 is described as a processing unit, it is possible to used integrated circuits to perform the same operations.

Figure 4:
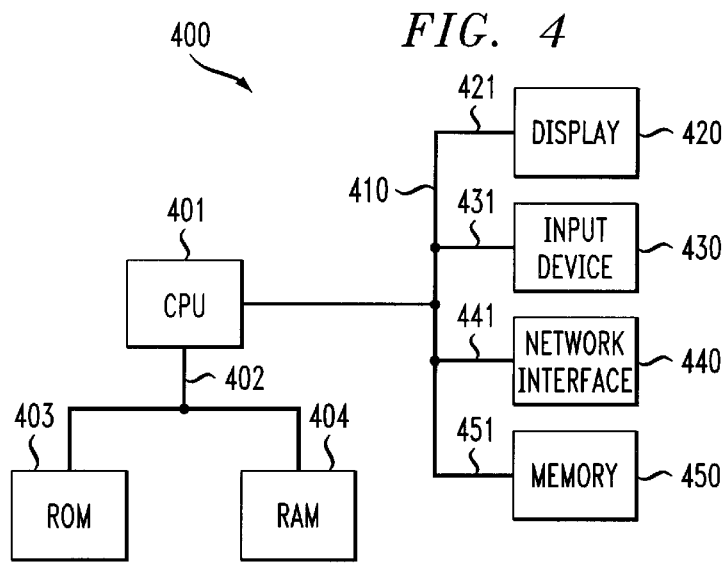
FIG. 4 illustrating a computer system capable of executing a process for optimizing parameters.

FIG. 4 illustrates a computer system 400 that can also perform the software instructions for determining the optimal settings as described by the present invention. Computer system 400 has a central processing unit (CPU) 401 which executes instructions read from a memory to perform applications that comprise the operations of computer system 400. CPU 401 is connected to a memory bus 402. Memory bus 402 allows CPU 401 to access Read Only Memory (ROM) 403 and Random Access Memory 404. ROM 403 is a memory that stores instructions for performing the basic operative tasks of computer system 400. RAM 404 is a memory that stores the instructions and data needed to execute applications that are performed by computer system 400.

I/O bus 410 connects CPU 401 to a plurality of peripheral devices. CPU 401 receives and transmits data to the peripheral devices via I/O bus 410. The peripheral devices connected to I/O bus 410 can include, but are not limited to, display 420, input device 430, network interface 440, and non-volatile memory 450. Display 420 is connected to I/O bus 410 by path 421 and includes a video driver and connected monitor for displaying information to a user. Input device 430 is connected to I/O bus 410 via path 431 and is a keyboard, mouse and/or other device attached to an appropriate driver for receiving input data from a user. Network interface 440 is connected to I/O bus 410 via path 441. Network interface 440 is a device, such as a modem or Ethernet device driver, that allows computer system 400 to communicate with a second processing system. Non-volatile memory 450 is a device, such as a disk drive, connected to I/O bus 410 via path 451 and which can read and write data to a disk or other storage media to store the data for future use.

The present invention is a system for generating a non-linear relationship between the settings of a stencil printing machine and an output solder thickness. The system of this invention maps the setting inputs to the outputs through a series of weighted equations. Then determines optimal settings of the stencil printing needed to generate the desired leads. One method for performing the mapping is the use of a neural network to model the system.

Neural network models are similar to statistical correlations because they provide correlations or algebraic expressions that are used to convert a system input into a system output. On the other hand, the neural network processing techniques that are used to develop the algebraic expression are quite different from statistical correlations. One example of a well known statistical correlation technique is the multiple order least squares fit that calculates a polynomial expression which defines a line having a minimum error determined with respect to a plurality of data points. These types of statistical curve-fitting techniques are difficult or impossible to perform if many variables (e.g., thirteen variables) influence the calculation, or if there exist nonlinear relationships between the many variables. It can be extremely difficult to incorporate auxiliary measurement data into statistical correlations. Neural network techniques overcome these difficulties by mapping an input vector to an output vector through the application of weighing factors to the system inputs.

Neural network processing techniques are well known, and can be accomplished on a variety of software that is available to the public, such as the Neural Network add-on package available from SAS Institute, Inc., of Cary, N.C., or the Neurowindows package from Ward Systems Group, Inc., of Frederick, Md. There exist many different varieties of neural network processing. While a comprehensive presentation of all known neural network processing techniques is beyond the scope of this discussion, a brief overview of the neural network theory that is presently employed suffices to explain the preferred techniques to those skilled in the art.

Figure 5:
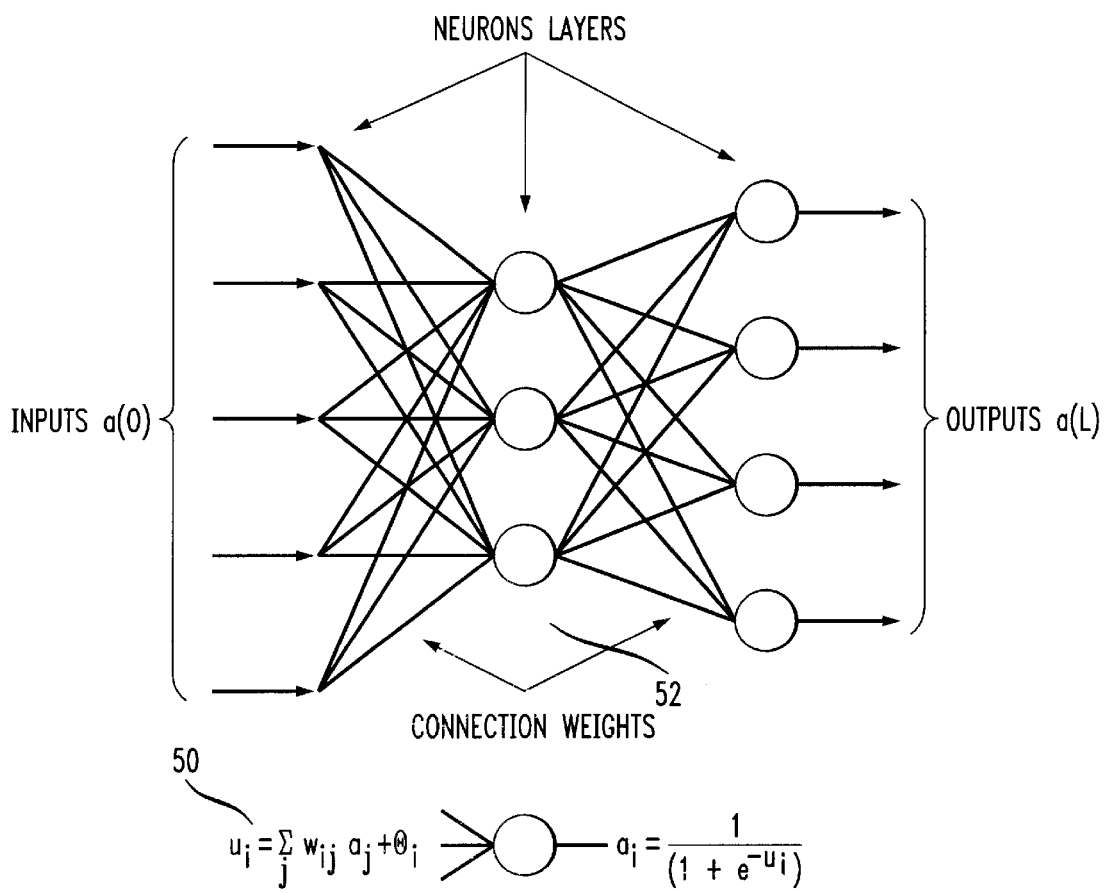
FIG. 5 illustrating an overview of a process that optimizes the settings of a stencil printing machine.

FIG. 5 depicts the classical operation of a neural network processing algorithm 50 that is commonly referred to as a feed-forward multi layer perceptron. Algorithm 50 is a parameterized mapping process that relates an input vector a(0) to an output vector a(L) through the function Φ:

$$\bar{a}(L) = \Phi(\overline{W}, \bar{a}(0))) \tag{1}$$

wherein W is the vector of weights; L is the number of layers in the network, and the remaining variables are defined above. According to Equation (1) in the context of FIG. 5, passing an input vector a(0) through algorithm 50 to arrive at an output vector a(L) includes taking the inner product of W times a(0) and feeding this product to a nonlinear system of neurons, e.g., neuron 52.

In feed-forward systems, algorithm 50 is trained to arrive at a correct answer by adjusting the weighing factors W to reduce or minimize the discrepancy between a target vector t and the output vector a(L). System inputs a(0) include parameter settings for solder application apparatus from a training data set and also preferably include other relevant data that is known to influence the system inputs a(0) or the system outputs a(L). (PLEASE PROVIDE EXAMPLES IF KNOWN) The inclusion of this type of other relevant data often enhances the reliability of a neural network system. The training data set also includes a set of target input data points, e.g., settings for squeegee speed of the printing machine, angle of the squeegee, time of separation, snap-off distance, head pressure, and squeegee material.

The object of neural network processing is to minimize the discrepancy between the target vector t and the output vector a(L). This discrepancy is commonly referred to as the cost function, and is most often defined as the sum squared error E of the output units of the vector a(L), i.e.:

$$E = \tfrac{1}{2}(\bar{t}-\bar{a}(L))^T(\bar{t}-\bar{a}(L)) \quad (2)$$

wherein t is the target data vector; superscript T is a vector transposition function; E is the difference between the squares of the vector t and a(L); and the remaining variables are defined above.

Back propagation is used to compute a gradient of the cost function E to minimize the cost. Equation (3) sets forth the Back propagation algorithm:

$$\overline{W}^{(n+1)} - \overline{W}^n = -\eta \frac{E}{\partial \overline{W}^{(n)}} + \mu \Delta \overline{W}^{(n+1)} \quad (3)$$

wherein $\mu$ is a learning rate parameter; $\Delta$ is a momentum parameter; n is an iteration count; W are weight vectors; and the remaining variables are defined above. Thus, numerous iterations of algorithm 50 are performed with different weighing factors to arrive at a solution or output vector a(L) having an acceptably low error. It is a common practice to provide the initial output vector and weighing factors as an initial guess for what the values should be. The initial guess provides an inherent bias to the neural network system, but this bias is reduced or completely eliminated as successive iterations provide additional weighing factors that minimize the cost function.

Figure 6:
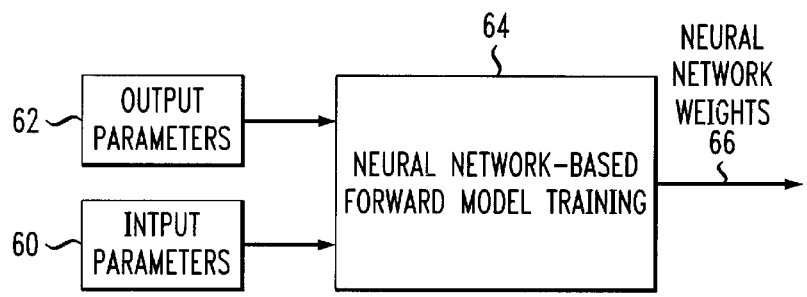
FIG. 6 illustrates a conceptual view of a forward training model of a neural network.

FIG. 6 schematically depicts the operation of a neural network based on forward system training. A training data set including an input vector a(0) of parameter settings for the stencil and a target data set t of physical parameters 62 for the leads. The forward system 64 operates according to Equation (1) to map the input settings 60 to an output vector a(L). The cost of this mapping is minimized according to Equations (2) and (3) to produce optimum weights 66.

Figure 7:
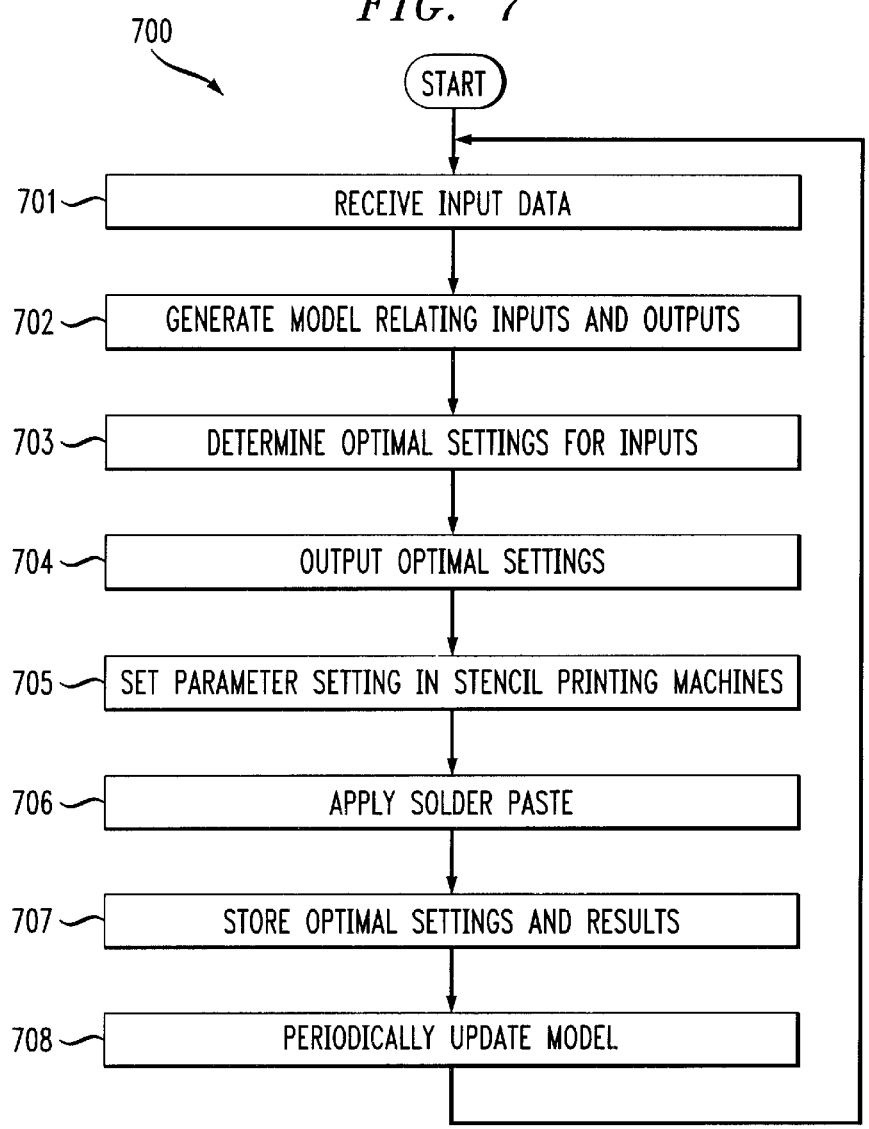
FIG. 7 illustrates a conceptual view of back propagation performed in the neural network to optimize the setting of a stencil printing machine.

FIG. 7 illustrates process 700 executed by a processing system to determine optimal setting for solder application apparatus 301. Process 700 begins in step 701 by receiving a set of input data including settings of the parameter and the resulting output lead. In step 702, a neural network model relating the input parameters to the resulting leads is generated. In step 703, back propagation is applied to the neural network to determine the optimal settings for the input parameters. The optimal settings are output in step 704.

Steps 705–708 are optional steps performed by a controller 302 that controls operation of solder application apparatus mechanism 301. In step 705, the parameter settings are set by controller 302 to the optimal settings that are output in step 704. In step 706, the solder is applied to a circuit board 100 to generates leads 101. In step 707, the parameter setting and output measurements are stored for future use in updating the neural network. In step 708, the neural network is periodically updated and process 700 is repeated from step 701.

The above is a description a system for determining the optimal setting for a stencil printing machine. It is possible for those skilled in the art to design other systems that infringe on this invention as set forth in the claims below either literally or through the doctrine of equivalents.

What is claimed is:

1. A method for determining optimal settings for a plurality of parameters that are used to regulate the operation of a stencil printing machine which applies a lead of solder paste to conductive paths located on a printed circuit board to enable the connection of circuit elements to said conductive paths, said method comprising the steps of:

receiving input data representing said plurality of parameters and measurements of characteristics of said solder paste applied by said stencil printing machine, including:

measuring a thickness of each said lead of said solder paste, measuring a width of each said lead of solder paste;

generating, in response to receipt of said input data, a neural network model that serves to map said plurality of parameters to said measured characteristics of said solder paste applied by said stencil printing machine, including increasing an accuracy of said width of each said lead of solder paste as a spacing between adjacent conductive paths located on a printed circuit board decreases;

determining, in response to generation of said model, a set of optimal settings for said plurality of parameters from said model; and outputting said set of optimal settings to regulate the operation of said stencil printing machine.

2. The method of claim 1 wherein said step of determining said set of optimal settings comprises the step of:

performing back propagation on said neural network model.

3. The method of claim 2 further comprising the step of:

storing, in response to said step of outputting, said set of optimal settings in a memory.

4. The method of claim 3 further comprising the step of:

storing said measured characteristics of said solder paste applied by said stencil printing machine in said memory with said set of optimal settings associated with said measured characteristics of said solder paste applied by said stencil printing machine.

5. The method of claim 4 further comprising the step of:

periodically updating said model with said set of optimal settings and said associated measured characteristics of said solder paste applied by said stencil printing machine that are stored in said memory.

6. A system for determining optimal settings for a plurality of parameters that are used to regulate the operation of a stencil printing machine which applies a lead of solder paste to conductive paths located on a printed circuit board to enable the connection of circuit elements to said conductive paths, comprising:

means for receiving input data representing said plurality of parameters and measurements of characteristics of said solder paste applied by said stencil printing machine, including:

means for measuring a thickness of each said lead of said solder paste, means for measuring a width of each said lead of solder paste;

means, responsive to receipt of said input data, for generating a neural network model that serves to map said plurality of parameters to said measured characteristics of said solder paste applied by said stencil printing machine, including increasing an accuracy of said width of each said lead of solder paste as a spacing between adjacent conductive paths located on a printed circuit board decreases;

means, responsive to generation of said model, for determining a set of optimal settings for said plurality of parameters from said model; and means for outputting said set of optimal settings to regulate the operation of said stencil printing machine.

7. The system of claim 6 wherein said means for determining said set of optimal settings comprises:

means for performing back propagation on said neural network model.

8. The system of claim 6 further comprising:

means, responsive to said means for outputting, for storing said set of optimal settings in a memory.

9. The system of claim 8 further comprising:

means for storing said measured characteristics of said solder paste applied by said stencil printing machine in said memory with said set of optimal settings associated with said measured characteristics of said solder paste applied by said stencil printing machine.

10. The system of claim 9 further comprising:

means for periodically updating said model with said set of optimal settings and said associated measured characteristics of said solder paste applied by said stencil printing machine that are stored in said memory.

* * * * *